United States Patent
Bommireddipalli et al.

(10) Patent No.: US 10,547,299 B1
(45) Date of Patent: Jan. 28, 2020

(54) FAST TRANSIENT AND LOW POWER THIN-GATE BASED HIGH-VOLTAGE SWITCH

(71) Applicant: TEXAS INSTRUMENTS INCORPORATED, Dallas, TX (US)

(72) Inventors: Aditya Vighnesh Ramakanth Bommireddipalli, Tucson, AZ (US); Christopher Paul Lash, Portland, OR (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/418,507

(22) Filed: May 21, 2019

Related U.S. Application Data

(60) Provisional application No. 62/798,091, filed on Jan. 29, 2019.

(51) Int. Cl.
*H01L 27/105* (2006.01)
*H03K 17/041* (2006.01)

(52) U.S. Cl.
CPC .............. *H03K 17/04106* (2013.01)

(58) Field of Classification Search
USPC .................... 327/147–149, 156–158
See application file for complete search history.

(56) References Cited

U.S. PATENT DOCUMENTS

| | | | |
|---|---|---|---|
| 5,105,246 A * | 4/1992 | Da Costa ................ | H01L 27/13 257/347 |
| 6,018,260 A * | 1/2000 | Gabara ................... | H03M 9/00 327/201 |
| 6,081,152 A * | 6/2000 | Maley ..................... | H03K 5/08 326/68 |
| 10,027,325 B1 * | 7/2018 | Graves ............ | H03K 19/018521 |
| 10,110,231 B1 * | 10/2018 | Graves ............ | H03K 19/018528 |
| 2004/0080474 A1 * | 4/2004 | Kimura ................ | H01L 27/1255 345/82 |
| 2006/0192019 A1 * | 8/2006 | Kato ................. | G06K 19/07749 235/492 |
| 2006/0290433 A1 * | 12/2006 | Leenaerts ............. | H03K 23/662 331/16 |
| 2007/0046338 A1 * | 3/2007 | Bhattacharya ............................ | H03K 19/018521 327/112 |
| 2007/0063993 A1 * | 3/2007 | Shishido .............. | G09G 3/3241 345/175 |

(Continued)

*Primary Examiner* — Adam D Houston
(74) *Attorney, Agent, or Firm* — John R. Pessetto; Charles A. Brill; Frank D. Cimino

(57) ABSTRACT

A circuit includes a first transistor having a first control input and first and second current terminals, and a second transistor having a second control input and third and fourth current terminals. A third transistor has a third control input and fifth and sixth current terminals, the fifth current terminal coupled to the first current terminal at a first supply voltage node. A fourth transistor has a fourth control input and seventh and eighth current terminals, the seventh current terminal coupled to the second and sixth current terminals. A pulse generator has a pulse generator input and a first pulse generator output, the pulse generator input configured to receive a switch control signal, and the first pulse generator output coupled to the first control input. The third control input is configured to receive either the switch control signal or a logical inverse of the switch control signal.

20 Claims, 3 Drawing Sheets

(56) References Cited

U.S. PATENT DOCUMENTS

| | | | |
|---|---|---|---|
| 2007/0085576 A1* | 4/2007 | Sanchez | H03K 19/018507 327/112 |
| 2009/0160494 A1* | 6/2009 | Jan | H03K 19/00315 327/108 |
| 2009/0224245 A1* | 9/2009 | Umezaki | G11C 19/28 257/59 |
| 2009/0261867 A1* | 10/2009 | Gundo | H03K 19/018521 327/108 |
| 2010/0231266 A1* | 9/2010 | Kishor | H04L 25/0272 327/108 |
| 2010/0264958 A1* | 10/2010 | Nakamura | H03K 17/284 327/109 |
| 2011/0068833 A1* | 3/2011 | Hebert | H03G 1/0088 327/109 |
| 2011/0175649 A1* | 7/2011 | Wadekar | H04L 25/0272 327/109 |
| 2011/0227062 A1* | 9/2011 | Kato | G11C 16/0408 257/43 |
| 2012/0024963 A1* | 2/2012 | Shionoiri | G06K 19/07783 235/492 |
| 2012/0062190 A1* | 3/2012 | Haiplik | H02M 3/156 323/271 |
| 2012/0326756 A1* | 12/2012 | Amighini | G01R 31/2621 327/109 |
| 2017/0199534 A1* | 7/2017 | Chen | G05F 1/56 |
| 2019/0007046 A1* | 1/2019 | Graves | H03K 19/018521 |
| 2019/0288011 A1* | 9/2019 | Umezaki | G09G 3/3677 |

* cited by examiner

FAST TRANSIENT AND LOW POWER THIN-GATE BASED HIGH-VOLTAGE SWITCH

CROSS-REFERENCE TO RELATED APPLICATIONS

This application claims priority to U.S. Provisional Application No. 62/798,091, filed Jan. 29, 2019, which is hereby incorporated by reference.

BACKGROUND

Transistor switches can be used for a variety of purposes, such as to turn power on to a load. A transistor switch turns on in response to a signal applied to its control input (e.g., gate in the case of a metal oxide semiconductor field effect transistor, MOSFET). The speed at which the transistor switch turns on is not significant in some applications, but in other applications, the switching speed of the transistor switch is significant. For example, in a cellular network base station, the circuitry may be powered off at times when not in use, and then powered on when needed. Turning on the circuitry in a base station should occur fairly quickly. For example, a design specification may specify that the supply voltage to the circuitry should reach 99% of its final voltage level within 500 nanoseconds of beginning the power-on process.

SUMMARY

In one example, A circuit includes a first transistor having a first control input and first and second current terminals, and a second transistor having a second control input and third and fourth current terminals, the third current terminal coupled to the second current terminal and to the second control input. A third transistor has a third control input and fifth and sixth current terminals, the fifth current terminal coupled to the first current terminal at a first supply voltage node. A fourth transistor has a fourth control input and seventh and eighth current terminals, the seventh current terminal coupled to the second and sixth current terminals and to the fourth control input. A pulse generator has a pulse generator input and a first pulse generator output, the pulse generator input configured to receive a switch control signal, and the first pulse generator output coupled to the first control input. The third control input is configured to receive either the switch control signal or a logical inverse of the switch control signal.

BRIEF DESCRIPTION OF THE DRAWINGS

For a detailed description of various examples, reference will now be made to the accompanying drawings in which.

DETAILED DESCRIPTION

Figure 1:
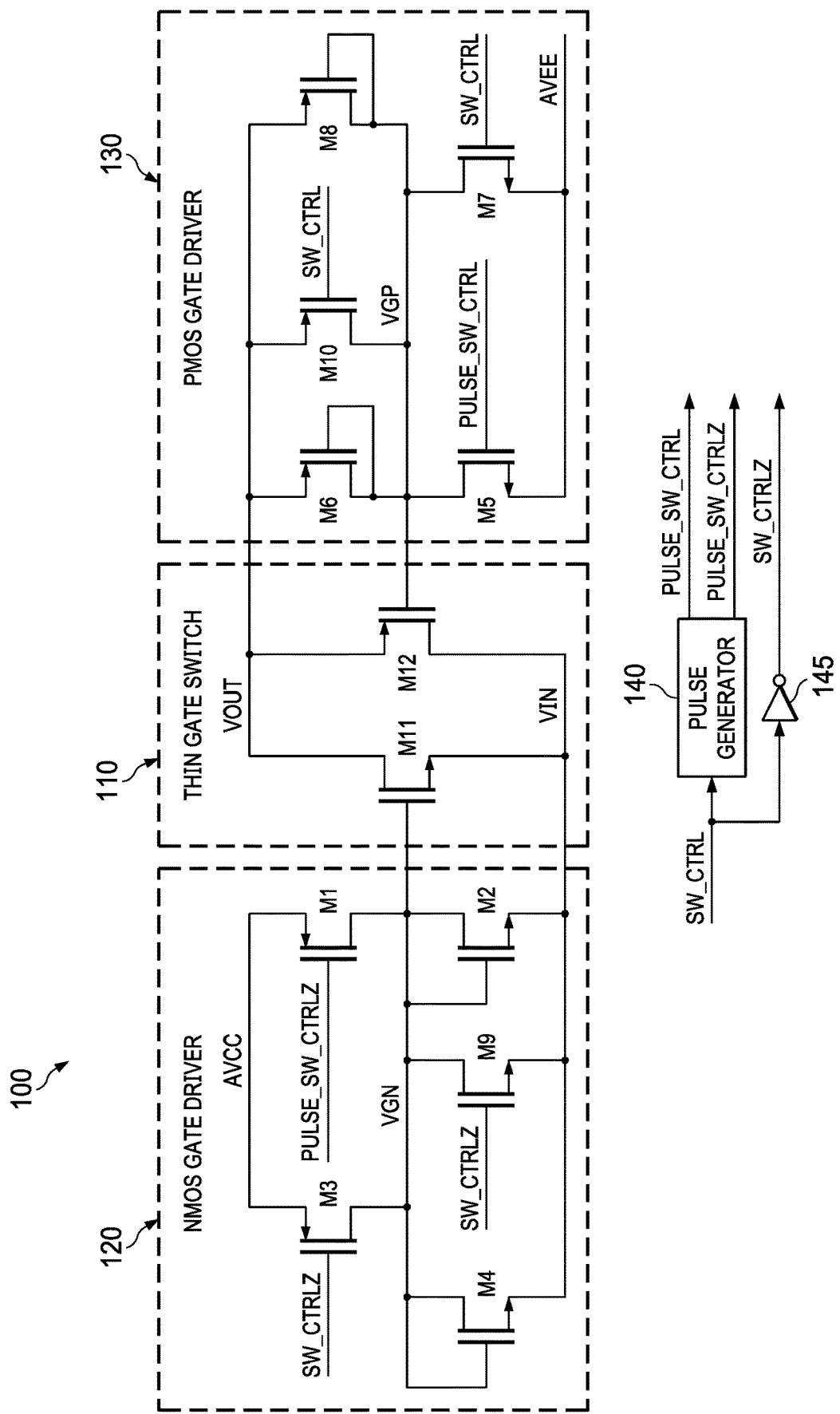
FIG. 1 illustrates a circuit example of gate drivers usable to turn on a transistor switch.

FIG. 1 shows an example of a circuit 100 that includes a thin gate switch 110, an n-type metal oxide semiconductor field effect transistor (NMOS) gate driver 120, a p-type metal oxide semiconductor field effect transistor (PMOS) gate driver 130, a pulse generator 140, and an inverter 145. The thin gate switch 110 includes switches M11 and M12. In this example, switch M11 comprises an NMOS transistor, and switch M12 comprises a PMOS transistor. Each switch M11 and M12 in this example is a thin gate transistor. The reference to "thin gate" refers to the thickness of the oxide layer of the transistor, and in one example refers to oxide thickness of the oxide layer in the range of, for example, 130 Angstroms to 150 Angstroms. In one specific example, the oxide layer is 130 Angstroms thick. In another example, the thickness of the oxide layer in the range of 42 to 52 Angstroms. With this oxide layer thickness, switches M11 and M12 have relatively small levels of resistance between drain and source when the transistors are on (rds_on), but cannot withstand gate-to-source voltages (Vgs) greater than about 5.5V. A Vgs voltage greater than 5.5V can damage a thin gate transistor.

The source of switch M11 is connected to the input voltage node (VIN), and the drain of switch M11 is connected to the output voltage node (VOUT). When the thin gate switch 110 is closed (on), VIN is provided to VOUT. The drain of switch M12 is connected to VIN, and the source of switch M12 is connected to VOUT. As such, the source of switch M11 is connected to the drain of switch M12, and the drain of switch M11 is connected to the source of switch M12. NMOS switch M11 is connected to, and controlled by, the NMOS gate driver 120, and PMOS switch M12 is connected to, and controlled by, the PMOS gate driver 130.

In the example of FIG. 1, the NMOS gate driver 120 includes transistors M1, M2, M3, M4, and M9. In this example, transistors M1 and M3 comprise PMOS transistors, and transistors M2, M4, and M9 comprise NMOS transistors. The sources of transistors M1 and M3 are connected together at a first supply voltage node designated "AVCC." With respect to the ground potential, AVCC may be in the range of, for example, 0V to 5V. The drain of transistor M1 is connected to the drains of transistors M2, M3, M4, and M9, and to the gate of switch M11 at a node labeled "VGN". The voltage on VGN is applied to the gate of switch M11 to turn the switch M11 on and off.

The sources of transistors M2, M4, M9, and M11 are connected together and to the drain of switch M12 at the VIN node. In one example implementation, VIN may be in the range of −8V to 0V. The gate of transistor M2 is connected to its drain at the VGN node. Similarly, the gate of transistor M4 is connected to its drain at the VGN node. Thus, each of transistors M2 and M4 is connected in such a way to implement a diode-connected transistor.

The gates of transistors M3 and M9 receive a control signal labeled "SW_CTRLZ," which is the logical inverse of the SW_CTRL signal used in the PMOS gate driver 130. The gate of transistor M1 receives a control signal labeled PULSE_SW_CTRLZ, which logical inverse of the PULSE_SW_CTRL signal use in the PMOS gate driver 130. The use and timing of the SW_CTRL, SW_CTRLZ, PULSE_SW_CTRL, and PULSE_SW_CTRLZ signals is described below.

The size of a transistor refers to the ratio of the transistor's channel width (W) to its length (L). The size of transistor M1 is approximately equal to the size of transistor M2. The size of transistor M3 is approximately equal to the size of transistor M4. The size of transistors M1 and M2 is larger than the size of transistors M3 and M4. In one example, M1 and M2 is in the range of 5 to 10 times larger than M3 and M4. sources of M1 and M3 are connected together, as are their drains. For the same Vgs applied to transistors M1 and M3, because transistor M1 is larger than transistor M3, transistor M1 will have a larger drain current than transistor M3. Similarly, the drain current of transistor M2 will be larger than the drain current of transistor M4.

The PMOS gate driver 130 generally has a symmetrical architecture to that of the NMOS gate driver 120, but with PMOS transistors in place of NMOS transistors, and NMOS transistors in place of PMOS transistors. The PMOS gate driver 130 includes transistors M5, M6, M7, M8, and M10. In this example, transistors M5 and M7 comprise NMOS transistors, and transistors M6, M8, and M10 comprise PMOS transistors. The sources of transistors M5 and M7 are connected together at a second supply voltage node designated "AVEE." With respect to the ground potential, AVEE may be in the range of, for example, −10V to −8V. The drain of transistor M5 is connected to the drains of transistors M6, M7, M8, and M10, and to the gate of switch M12 at a node labeled "VGP". The voltage on VGP is applied to the gate of switch M12 to turn the switch M12 on and off. The sources of transistors M6, M8, M10, and M12 are connected together and to the drain of switch M11 at the VOUT node. The gate of transistor M6 is connected to its drain at the VGP node. Similarly, the gate of transistor M8 is connected to its drain at the VGP node. Thus, each of transistors M6 and M8 is connected in such a way to implement a diode-connected transistor. The gates of transistors M7 and M10 receive the SW_CTRL signal, and the gate of transistor M5 receives the PULSE_SW_CTRL signal.

One or more of the transistors shown in the example of FIG. 1 can be implemented in other examples with a different type of transistor from that shown. For example, NMOS diode connected transistors M2 and M4 could be implemented with PMOS diode connected transistors, and PMOS diode connected transistors M6 and M8 could be implemented with NMOS diode connected transistors FIG. 1 shows that the SW_CTRL signal is provided to an input of inverter 145. The output of inverter 145 is SW_CTRLZ. FIG. 1 shows that the SW_CTRLZ signal is provided to the gates of transistors M3 and M9, and that the SW_CTRL signal is provided to the gates of M7 and M10. The SW_CTRL signal is also provided to the pulse generator 140. The pulse generator 140 includes a one-shot circuit which generates a pulse (PULSE_SW_CTRL) of a predefined width upon detection of, for example, a rising edge of the SW_CTRL input signal. The pulse generator 140 includes an inverter or otherwise generates a logic inverse of PULSE_SW_CTRL as PULSE_SW_CTRLZ.

The size of transistor M5 is approximately equal to the size of transistor M6. The size of transistor M7 is approximately equal to the size of transistor M8. The size of transistors M5 and M6 is larger than the size of transistors M7 and M8. In one example, M5 and M6 is in the range of 5 to 10 times larger than M7 and M8. The sources of M5 and M7 are connected together, as are their drains. For the same Vgs applied to transistors M5 and M7, because transistor M5 is larger than transistor M7, transistor M5 will have a larger drain current than transistor M7. Similarly, the drain current of transistor M6 will be larger than the drain current of transistor M8.

Figure 2:
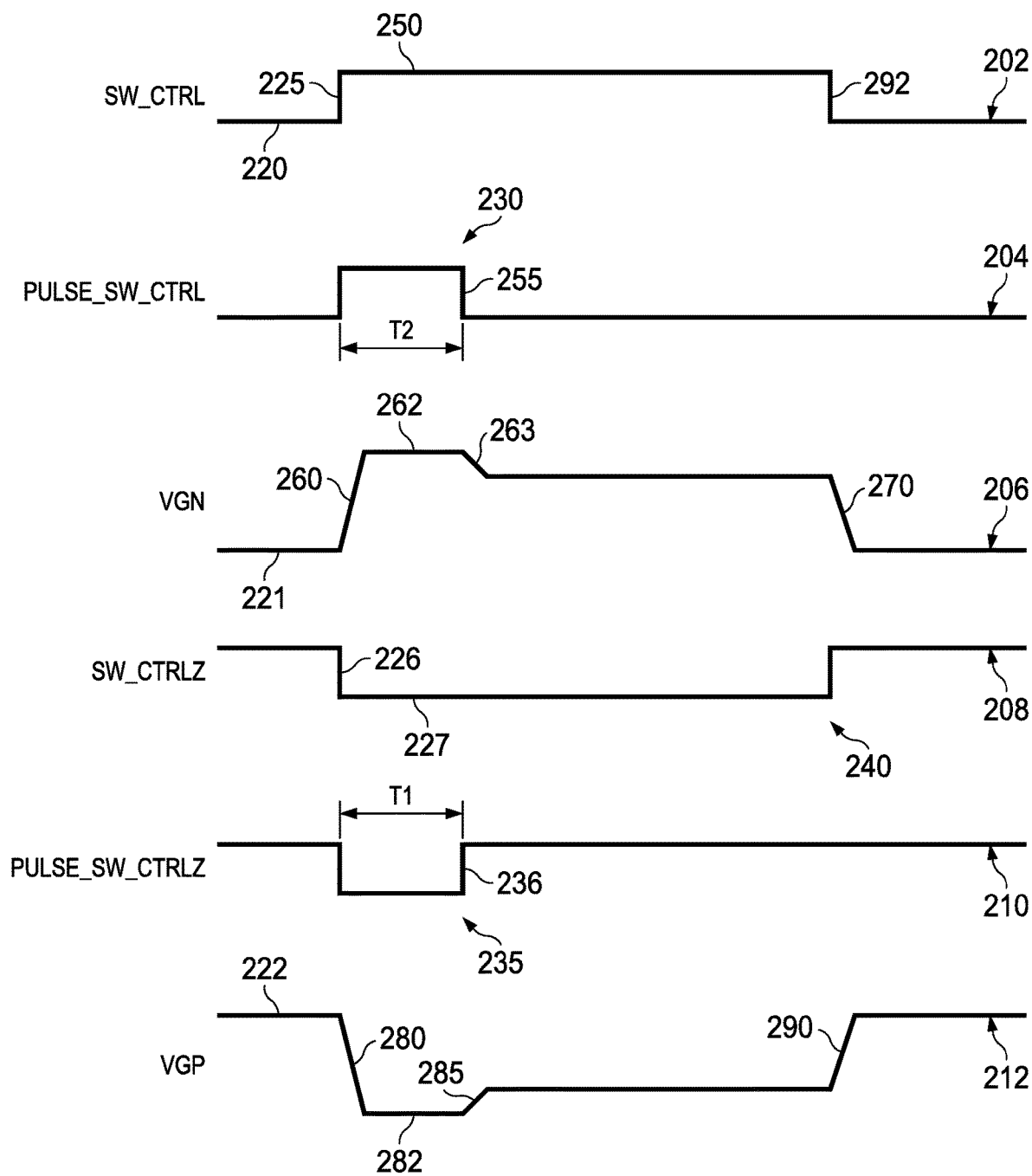
FIG. 2 shows a timing diagram of various signals within the circuit of FIG. 1.

FIG. 2 shows an example timing diagram of various signals within the circuit of FIG. 1. The signals shown include the SW_CTRL signal 202, the PULSE_SW_CTRL signal 204, the VGN voltage 206, the SW_CTRLZ signal 208, the PULSE_SW_CTRLZ signal 210, and the VGP voltage 212. At 220, with the SW_CTRL signal 202 low and the SW_CTRLZ signal 208 high, transistors M9 and M10 are on. With transistor M9 being on, the VGN voltage is equal to VIN (at 221) and the VGP voltage is equal to VOUT (at 222). As the source of switch M11 is connected to VIN, with the VGN voltage equaling VIN, the gate-to-source of the switch M11 will be approximately 0V, and thus switch M11 will be off. Similarly, as the source of switch M12 is connected to VOUT, with the VGP voltage equaling VOUT, the gate-to-source of switch M12 also will be approximately 0V, and thus switch M12 will be off. With both switches M11 and M12 off, the input voltage is not provided to the output voltage node VOUT, and any circuitry powered using VOUT will be off.

The SW_CTRL signal is asserted high at 225 (and thus SW_CTRLZ is asserted low at 226). The SW_CTRL signal is asserted by logic to turn on power to a load connected to VOUT. With SW_CTRL high and SW_CTRLZ low, M9 and M10 are turned off and remain off as long as SW_CTRL remains high and SW_CTRLZ remains low.

Considering the operation of the NMOS gate driver 120, with SW_CTRLZ low at 227), M3 will be on. Further, the pulse generator 140 generates a positive pulse 230 for the PULSE_SW_CTRL signal 204, and a negative pulse 235 for the PULSE_SW_CTRLZ signal 210. The negative pulse 235 for PULSE_SW_CTRLZ causes the transistor M1 to turn on for the duration of the pulse 235 (T1), and then turn off at 236 as PULSE_SW_CTRLZ becomes logic high. As such, during negative pulse 235, both transistors M1 and M3 are on. As transistor M1 is larger than transistor M3, the drain current through transistor M1 is larger than the drain current through transistor M3. The current flow into the gate of switch M11 charges the gate-to-source capacitance of switch M11. Due to the size of transistor M1, the gate-to-source capacitance of switch M11 is charged with a relatively large current, and thus switch M11 turns on rapidly.

Once the negative pulse 235 ends at edge 236, transistor M1 is turned off, but transistor M3 remains on due to SW_CTRLZ remaining low as shown at 240. The transistor M3 is smaller than transistor M1 as explained above and thus the drain current through transistor M3 is smaller than the current through transistor M1. As such, the current into the gate of switch M11 is smaller after M1 turns off, but switch M11 remains on nevertheless. For a short period of time (the time duration T1 of the negative pulse 235), the transistor M1 is used to turn on switch M11 rapidly. Transistor M3 functions to continue to maintain switch M11 in its on state. Thus, switch M11 is turned on "hard" for a short period of time, and once switch M11 is on, the large current used to turn on switch M11 is decreased to reduce the steady state power consumption of the circuit.

The operation of the PMOS gate driver 130 to turn on switch M12 is similar. With SW_CTRL high at 250), M7 will be on. The positive pulse 230 for PULSE_SW_CTRL causes the transistor M5 to turn on for the duration of the pulse 230 (T2), and then turn off at 255 as PULSE_SW_CTRL becomes logic low. As such, during positive pulse 230, both transistors M5 and M7 are on. As transistor M5 is larger than transistor M7, the drain current through M5 is larger than the drain current through M7. The current flow into the gate of switch M12 charges the gate-to-source capacitance of switch M12. Due to the size of transistor M5, the gate-to-source capacitance of switch M12 is charged with a relatively large current, and thus switch M12 turns on rapidly.

Once the positive pulse 230 ends at edge 255, transistor M5 is turned off, but transistor M7 remains on due to SW_CTRL remaining high as shown at 250. Transistor M3 is smaller than transistor M1 as explained above and thus the drain current through transistor M3 is smaller than the current through transistor M1. As such, the current into the gate of switch M12 is smaller after transistor M5 turns off, but switch M12 remains on nevertheless. For a short period of time (the time duration T1 of the positive pulse 230), the transistor M5 is used to turn on switch M12 rapidly. Transistor M7 functions to continue to maintain switch M12 in its on state. Thus, switch M12 is turned on "hard" for a short period of time, and once switch M12 is on, the large current used to turn on switch M12 is decreased to reduce the steady state power consumption of the circuit.

Diode-connected transistors M2, M4, M6, and M8 function to ensure the voltage on the gates of transistor switches M11 and M12 does not become so large as to damage the transistor switches M11 and M12. In one example, the drain-to-source voltage (Vds) of transistors M11 and M12 is about 5V. As the sources of transistors M2, M4, and M11 are connected together, and the drains of transistors M2 and M4 are connected to the gate of switch M11, the Vds generated by transistors M2 and M4 is the Vgs of switch M11. Transistors M2 and M4 are sized such that their Vds is limited to 5V. Because the Vds of transistors M2 and M4 is limited to 5V, the Vgs of switch M11 will not exceed 5V, thereby protecting switch M11. The same protection to switch M12 is provided by the diode-connected transistors M6 and M8.

The voltage on the VGN node is initially (221) equal to VIN because transistor M9 is on as explained above. Once SW_CTRLZ becomes low at 226, M9 turns off and the voltage on the VGN node ramps up (260) as current from transistor M1 flows into the gate of switch M11 to charge up the gate-to-source capacitance of switch M11. The voltage on the VGN node levels out at 262 at a voltage that is VIN plus the diode voltage drop across transistors M2, M4. When transistor M1 is then turned off at 236, the voltage on node VGN drops slightly as shown at 263 due to a drop in current flowing into the gate of diode-connected transistors M2 and M4. The voltage on the VGN node drops at 270 back to VIN due to SW_CTRLZ being logic high and again turning on transistor M9.

The voltage on the VGP node is initially (222) equal to VOUT because transistor M10 is on as explained above. Once SW_CTRL becomes high at 225, M10 turns off and the voltage on the VGP node ramps down (280) as current from transistor M5 flows into the gate of switch M12 to charge up the gate-to-source capacitance of switch M12. The voltage on the VGP node levels out at 282 at a voltage that is VOUT minus the diode voltage drop across transistors M6, M8. When transistor M5 is then turned off at 255, the voltage on node VGP increases slightly as shown at 285 due to a drop in current flowing into the gates of diode-connected transistors M6 and M8. The voltage on the VGP node increases at 290 back to VOUT due to SW_CTRL being logic low (292) and again turning on transistor M10.

The example of FIG. 1 includes an NMOS gate driver 120 configured to control switch M11, and a PMOS gate driver 130 configured to control switch M12. Depending on the voltage levels supplied for AVEE and AVCC, as well as VIN, one or the other or both of the gate drivers 120, 130 are operative to control their respective switches. For example, if AVCC and VIN were close together (e.g., both approximately 0V), the transistors of the NMOS gate driver 120 might not have sufficient headroom to turn on, but the transistors of the PMOS gate driver 130 (which does not receive AVCC) would have sufficient headroom and thus would be operative to control switch M12. Alternatively, VOUT may be approximately equal to AVEE and thus the transistors of the PMOS gate driver 130 might not be operable. In this latter case, the NMOS gate driver 120 would be operative. For other combinations of AVCC and AVEE voltages, both gate drivers 120, 130 are operative simultaneously to turn on their respective switches M11, M12.

Figure 3:
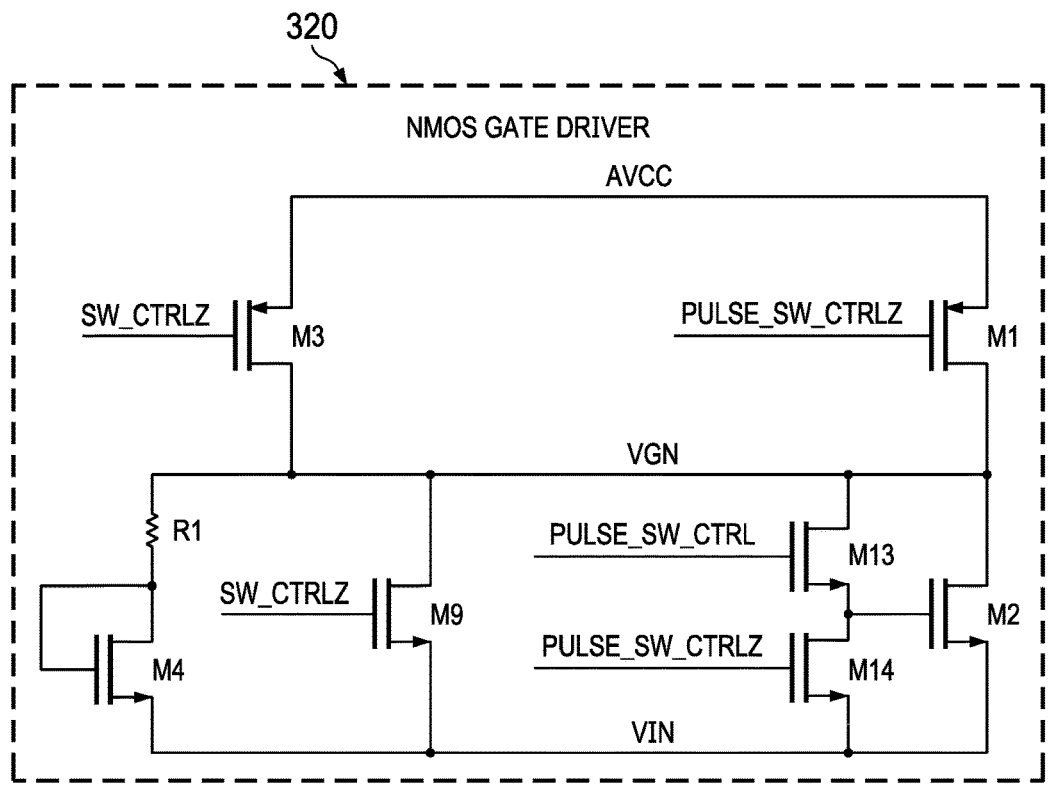
FIG. 3 shows another example of a gate driver usable in the circuit of FIG. 1.

FIG. 3 shows another example of an NMOS gate driver 320. The NMOS gate driver 320 is configured similar to the NMOS gate driver 120 of FIG. 1 with several differences. A resistor R1 is connected between the drains of transistors M3 and M4. When SW_CTRLZ is low, the voltage at VGN is increased by R1 multiplied by a portion of the drain current through M3 and M1. This increase in voltage allows a larger "overdrive" voltage for M11. The resistor R1 is sized or "tuned" to give VGS of M11 equal to 5V. There are several combinations of sizing M4, R1, M2, M1 and M3 to provide a Vgs of 5V for M11. As a result, a relatively constant Vgs for M11 is maintained over process, supply voltage, and temperature.

Another difference between the NMOS gate driver 320 of FIG. 3 relative to the NMOS gate driver 120 of FIG. 1 is the addition of transistors M13 and M14 in FIG. 3. Both transistors are NMOS transistors in this example. The drain of transistor M13 is coupled to the VGN node (and thus to the drains of transistors M2, M4, and M9). The source of transistor M13 is connected to the gate of transistor M2 and to the drain of transistor M14. The source of transistor M14 is connected at VIN to the sources of transistors M2, M4, and M9. The gate of transistor M13 receives the PULSE_SW_CTRL signal, and the gate of transistor M14 receives the PULSE_SW_CTRLZ signal. Because PULSE_SW_CTRL and PULSE_SW_CTRLZ are of opposite polarity, either transistor M13 will be on (but not transistor M14), or transistor M14 will be on (but not transistor M13). When transistor M13 is on, the gate of transistor M2 is coupled to its drain to configure transistor M13 as a diode-connected transistor. When transistor M13 is off and transistor M14 is on, the VIN voltage is coupled to both the source and the gate of transistor M2, and thus transistor M2 will be off. When the larger transistor M1 is on to quickly charge the gate-to-source capacitance of transistor M1, transistor M13 will be on as well to cause transistor M2 to be configured as a diode-connected transistor and used as described above. When transistor M1 is turned off, transistor M14 will be turned on thereby also turning off transistor M2. As such, both of transistors M1 and M2 are on only during the negative pulse 235. FIG. 2 shows the slight voltage drop at 263 as transistor M1 turns off at the end of the negative pulse 235. The drop occurs because less current flows into M4 and M2 when M1 is off. By turning off M2 when M1 turns off, the current of M3 flows entirely into M4 and R1. Turning off M2 when M1 turns off helps to maintain roughly the same current into M4 and R1 and thus the same VGN voltage when PULSE_SW becomes low at 255. FIG. 2 shows the slight voltage drop at 263 as transistor M1 turns off at the end of the negative pulse 235. The drop occurs because less current flows into M4 and M2 when M1 is off. By turning off M2 when M1 turns off, the current of M3 flows entirely into M4 and R1. Turning off M2 when M1 turns off helps to maintain roughly the same current into M4 and R1 and thus the same VGN voltage when PULSE_SW becomes low at 255.

Figure 4:
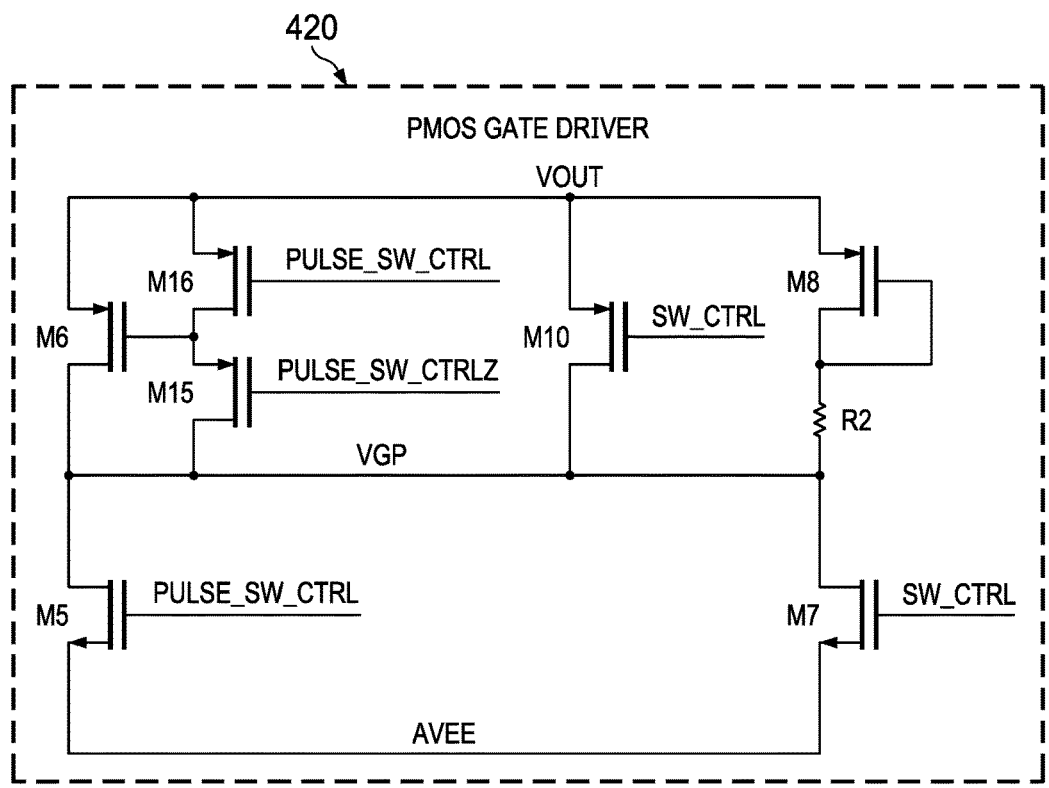
FIG. 4 shows another example of a gate driver usable in the circuit of FIG. 1.

FIG. 4 shows another example of a PMOS gate driver 420. The PMOS gate driver 420 is configured similar to the PMOS gate driver 130 of FIG. 1 with several differences—which are much the same as explained above regarding the NMOS gate driver 320. A resistor R2 is connected between the drains of transistors M7 and M8. When SW_CTRL is high, the voltage at VGP is decreased by R2 multiplied by a portion of the drain current through M5 and M7. This decrease in voltage allows a larger "overdrive" voltage for M12. The resistor R2 is sized, in one example, to give a Vgs of M12 equal to 5V. There are several combinations of sizing M8, R2, M6, M5 and M7 to provide a Vgs of 5V for M12. As a result, a relatively constant Vgs for M12 is maintained over process, supply voltage, and temperature Another difference between the NMOS gate driver 320 of FIG. 3 relative to the NMOS gate driver 120 of FIG. 1 is the addition of transistors M15 and M16 in FIG. 4 Both transistors are PMOS transistors in this example. The drain of transistor M15 is coupled to the VGP node (and thus to the drains of transistors M6 and M4, and to resistor R2). The source of transistor M15 is connected to the gate of transistor M6 and to the drain of transistor M16. The source of transistor M16 is connected at VOUT to the sources of transistors M6, M8, and M10. The gate of transistor M15 receives the PULSE_SW_CTRLZ signal, and the gate of transistor M16 receives the PULSE_SW_CTRL signal. Because PULSE_SW_CTRL and PULSE_SW_CTRLZ are of opposite polarity, either transistor M15 will be on (but not transistor M16), or transistor M16 will be on (but not transistor M15). When transistor M15 is on, the gate of transistor M6 is coupled to its drain to configure transistor M16 as a diode-connected transistor. When transistor M15 is off and transistor M16 is on, the VOUT voltage is coupled to both the source and the gate of transistor M6, and thus transistor M6 will be off. When the larger transistor M5 is on to quickly charge the gate-to-source capacitance of switch M12, transistor M15 will be on as well to cause transistor M6 to be configured as a diode-connected transistor and used as described above. When transistor M5 is turned off, transistor M16 will be turned on thereby also turning off transistor M6. As such, both of transistors M5 and M6 are on only during the positive pulse 230. Turning off M6 when M5 turns off helps to maintain roughly the same current into M8 and R2 and thus the same VGP voltage when PULSE_SW_CTRLZ becomes high at 236.

In this description, the term "couple" or "couples" means either an indirect or direct wired or wireless connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. A circuit, comprising:
   a first transistor having a first control input and first and second current terminals;
   a second transistor having a second control input and third and fourth current terminals, the third current terminal coupled to the second current terminal and to the second control input;
   a third transistor having a third control input and fifth and sixth current terminals, the fifth current terminal coupled to the first current terminal at a first supply voltage node;
   a fourth transistor having a fourth control input and seventh and eighth current terminals, the seventh current terminal coupled to the second and sixth current terminals and to the fourth control input;
   a first switch having a first switch control input coupled to the second, third, sixth, and seventh current terminals; and
   a pulse generator having a pulse generator input and a first pulse generator output, the pulse generator input configured to receive a switch control signal, and the first pulse generator output coupled to the first control input;
   wherein the third control input is configured to receive either the switch control signal or a logical inverse of the switch control signal.

2. The circuit of claim 1, wherein a ratio of channel width (W) to channel length (L) of the first transistor is greater than a W/L ratio of the third transistor.

3. The circuit of claim 1, wherein the first switch includes an oxide layer having a thickness in the range of 130 Angstroms to 150 Angstroms.

4. The circuit of claim 1, wherein the first transistor is to be on for a duration of a pulse output signal from the pulse generator, and the third transistor is to be on for the duration of the pulse output signal and to remain on following an end of the pulse output signal until an occurrence of a subsequent edge of the switch control signal or the logical inverse of the switch control signal.

5. The circuit of claim 1, further comprising a second switch coupled in parallel with the first switch.

6. The circuit of claim 5, wherein the first switch is one of an n-type metal oxide semiconductor field effect transistor (NMOS transistor) or a p-type metal oxide semiconductor field effect transistor (PMOS transistor), and the second switch is the other of an NMOS or PMOS transistor.

7. The circuit of claim 5, further comprising:
   a fifth transistor having a fifth control input and ninth and tenth current terminals;
   a sixth transistor having a sixth control input and eleventh and twelfth current terminals, the eleventh current terminal coupled to the tenth current terminal and to the sixth control input;
   a seventh transistor having a seventh control input and thirteenth and fourteenth current terminals, the thirteenth current terminal coupled to the ninth current terminal at a second supply voltage node; and
   an eighth transistor having an eighth control input and fifteenth and sixteenth current terminals, the fifteenth current terminal coupled to the tenth and fourteenth current terminals and to the eighth control input.

8. The circuit of claim 7, wherein the second switch has a second switch control input, the second switch control input coupled to the tenth, eleventh, fourteenth, and fifteenth current terminals.

9. The circuit of claim 7, wherein a pulse signal opposite in polarity from the pulse signal used to control the first control input is configured to control the fifth control input.

10. The circuit of claim 7, wherein whichever of the switch control signal or its logical inverse is provided to the third control input, the other of the switch control signal or its logical inverse is provided to the seventh control input.

11. A circuit, comprising:
   a first transistor having a first control input and first and second current terminals;
   a second transistor having a second control input and third and fourth current terminals, the third current terminal coupled to the second current terminal and to the second control input;
   a third transistor having a third control input and fifth and sixth current terminals, the fifth current terminal coupled to the first current terminal at a first supply voltage node;
   a fourth transistor having a fourth control input and seventh and eighth current terminals, the seventh current terminal coupled to the second and sixth current terminals and to the fourth control input;

a pulse generator having a pulse generator input and a first pulse generator output, the pulse generator input configured to receive a switch control signal, and the first pulse generator output coupled to the first control input;

wherein the third control input is configured to receive either the switch control signal or a logical inverse of the switch control signal.

12. The circuit of claim 11, wherein a ratio of channel width (W) to channel length (L) of the first transistor is greater than a W/L ratio of the third transistor.

13. The circuit of claim 11, wherein the first transistor is to be on for a duration of a pulse output signal from the pulse generator, and the third transistor is to be on for the duration of the pulse output signal and to remain on following an end of the pulse output signal until an occurrence of a subsequent edge of the switch control signal or the logical inverse of the switch control signal.

14. The circuit of claim 11, further comprising:
a fifth transistor having a fifth control input and ninth and tenth current terminals;
a sixth transistor having a sixth control input and eleventh and twelfth current terminals, the eleventh current terminal coupled to the tenth current terminal and to the sixth control input;
a seventh transistor having a seventh control input and thirteenth and fourteenth current terminals, the thirteenth current terminal coupled to the ninth current terminal at a second supply voltage node; and
an eighth transistor having an eighth control input and fifteenth and sixteenth current terminals, the fifteenth current terminal coupled to the tenth and fourteenth current terminals and to the eighth control input.

15. The circuit of claim 14, wherein whichever of the switch control signal or its logical inverse is provided to the third control input, the other of the switch control signal or its logical inverse is provided to the seventh control input.

16. A circuit, comprising:
a switch having a switch control input; and
a gate driver circuit comprising a plurality of transistors, the gate driver circuit configured to generate a first level of current into the switch control input of the transistor switch for a first period of time to turn on the switch, and then to generate a second level of current into the switch control input of the transistor switch to keep the switch on following the first period of time;
wherein the first level of current is greater than the second level of current.

17. The circuit of claim 16, wherein the gate driver circuit includes a first transistor configured to provide the first level of current, and a second transistor configured to provide the second level of current, wherein a ratio of channel width (W) to channel length (L) of the first transistor is greater than a W/L ratio of the second transistor.

18. A circuit, comprising:
a first transistor having a first control input and first and second current terminals;
a second transistor having a second control input and third and fourth current terminals, the third current terminal coupled to the first current terminal at a first supply voltage node;
a first switch having a first switch control input coupled to the second and fourth current terminals; and
a pulse generator having a pulse generator input and a first pulse generator output, the pulse generator input configured to receive a switch control signal, and the first pulse generator output coupled to the first control input;
wherein the second control input is configured to receive either the switch control signal or a logical inverse of the switch control signal.

19. The circuit of claim 18, further comprising:
a third transistor having a third control input and fifth and sixth current terminals, the fifth current terminal coupled to the second current terminal and to the third control input; and
a fourth transistor having a fourth control input and seventh and eighth current terminals, the seventh current terminal coupled to the second and fourth current terminals and to the fourth control input.

20. The circuit of claim 18, wherein a ratio of channel width (W) to channel length (L) of the first transistor is greater than a W/L ratio of the second transistor.

* * * * *